United States Patent
Ota

(10) Patent No.: US 11,674,040 B2
(45) Date of Patent: Jun. 13, 2023

(54) THERMALLY-CONDUCTIVE SILICONE GEL COMPOSITION, THERMALLY-CONDUCTIVE MEMBER, AND HEAT DISSIPATION STRUCTURE

(71) Applicant: DOW TORAY CO., LTD., Tokyo (JP)

(72) Inventor: Kenji Ota, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 0 days.

(21) Appl. No.: 16/633,452

(22) PCT Filed: Jul. 11, 2018

(86) PCT No.: PCT/JP2018/026226
§ 371 (c)(1),
(2) Date: Apr. 11, 2020

(87) PCT Pub. No.: WO2019/021824
PCT Pub. Date: Jan. 31, 2019

(65) Prior Publication Data
US 2020/0239758 A1    Jul. 30, 2020

(30) Foreign Application Priority Data
Jul. 24, 2017   (JP) .............................. JP2017-142709

(51) Int. Cl.
| | | |
|---|---|---|
| *C08L 83/04* | (2006.01) | |
| *C08K 3/22* | (2006.01) | |
| *H01M 10/613* | (2014.01) | |
| *H01M 10/655* | (2014.01) | |
| *C09K 5/14* | (2006.01) | |
| *H05K 7/20* | (2006.01) | |
| *C08K 3/04* | (2006.01) | |
| *C08K 5/5415* | (2006.01) | |
| *C08K 9/06* | (2006.01) | |
| *C08K 3/38* | (2006.01) | |
| *C08G 77/12* | (2006.01) | |
| *C08G 77/20* | (2006.01) | |

(52) U.S. Cl.
CPC ............... *C08L 83/04* (2013.01); *C08K 3/04* (2013.01); *C08K 3/22* (2013.01); *C08K 5/5415* (2013.01); *C08K 9/06* (2013.01); *C09K 5/14* (2013.01); *H01M 10/613* (2015.04); *H01M 10/655* (2015.04); *H05K 7/2039* (2013.01); *C08G 77/12* (2013.01); *C08G 77/20* (2013.01); *C08K 2003/385* (2013.01); *C08L 2201/08* (2013.01); *C08L 2205/025* (2013.01)

(58) Field of Classification Search
None
See application file for complete search history.

(56) References Cited

U.S. PATENT DOCUMENTS

| | | |
|---|---|---|
| 4,604,424 A | 8/1986 | Cole et al. |
| 6,169,142 B1 | 1/2001 | Nakano et al. |
| 2003/0049466 A1 | 3/2003 | Yamada et al. |
| 2004/0254275 A1 | 12/2004 | Fukui et al. |
| 2008/0139731 A1 | 6/2008 | Lawson et al. |
| 2010/0140538 A1 | 6/2010 | Sekiba |
| 2011/0188213 A1 | 8/2011 | Domae et al. |
| 2011/0311767 A1* | 12/2011 | Elahee .................... C08K 5/11 428/138 |
| 2013/0248163 A1* | 9/2013 | Bhagwagar ........... F28F 21/067 165/185 |
| 2016/0237332 A1* | 8/2016 | Merrill .................. H01L 23/373 |
| 2017/0121462 A1 | 5/2017 | Fujisawa et al. |
| 2018/0022977 A1 | 1/2018 | Tsuji |
| 2019/0292349 A1 | 9/2019 | Ito |
| 2020/0270499 A1* | 8/2020 | Ota ..................... H01M 10/613 |
| 2020/0270500 A1* | 8/2020 | Ota ..................... H01M 10/613 |

FOREIGN PATENT DOCUMENTS

| | | |
|---|---|---|
| JP | S62-184058 A | 8/1987 |
| JP | H11-209618 A | 8/1999 |
| JP | 2000-001616 A | 1/2000 |
| JP | 2002327116 A | 11/2002 |
| JP | 2005-162975 A | 6/2005 |
| JP | 2008-239719 A | 10/2008 |
| JP | 2008-546861 A | 12/2008 |
| JP | 2009209230 A | 9/2009 |
| JP | 2009-286855 A | 12/2009 |
| JP | 2013-124257 A | 6/2013 |
| JP | 2014503680 A | 2/2014 |
| JP | 2015-119173 A | 6/2015 |
| JP | 2016-151010 A | 8/2016 |

(Continued)

OTHER PUBLICATIONS

"Mechanical Packing of Spherical Particles" authored by McGeary and published in the Journal of the Ceramic Society (1961) 44(10), 514-522.*

(Continued)

*Primary Examiner* — Marc S Zimmer
(74) *Attorney, Agent, or Firm* — Warner Norcross + Judd LLP

(57) ABSTRACT

Provided is: a thermally conductive silicone gel composition which has a high thermal conductivity, and has excellent gap-filling ability and repairability; a thermally conductive member comprising the thermally conductive silicone gel composition; and a heat dissipation structure using the same. The thermally conductive silicone gel composition comprises: (A) an alkenyl group-containing organopolysiloxane; (B) a straight-chain organohydrogenpolysiloxane containing an average of 2 to 4 silicon-bonded hydrogen atoms per molecule, at least two of the hydrogen atoms are being located on a side chain of the molecular chain, wherein the amount of silicon-bonded hydrogen atoms in component (B) is 0.2 to 5 mol with respected to 1 mol of an alkenyl group contained in component (A); (C) a catalyst for hydrosilylation reaction; (D) a thermally conductive filler; and (E) an alkoxysilane having an alkyl group with 6 or more carbon atoms per molecule.

20 Claims, No Drawings

(56) References Cited

FOREIGN PATENT DOCUMENTS

| | | |
|---|---|---|
| JP | 2016-219738 A | 12/2016 |
| JP | 2017-039802 A | 2/2017 |
| JP | 2017-043717 A | 3/2017 |
| JP | 2017-210518 A | 11/2017 |
| WO | 2006107003 A1 | 10/2006 |
| WO | 2012102852 A1 | 8/2012 |
| WO | 2015/155950 A1 | 10/2015 |
| WO | 2016/140020 A1 | 9/2016 |

OTHER PUBLICATIONS

Showa Denka Product data sheet for AS series alumina (no date).*
International Search Report for PCT/JP2018/026226 dated Oct. 9, 2018, 2 pages.
Machine-assisted English translation of JP H11-209618 obtained from https://worldwide.espacenet.com on Feb. 4, 2020, 16 pages.
Machine-assisted English translation of JP 2005-162975 obtained from https://worldwide.espacenet.com on Feb. 1, 2020, 11 pages.
Machine-assisted English translation of JP 2013-124257 obtained from https://worldwide.espacenet.com on Feb. 4, 2020, 11 pages.
Machine-assisted English translation of JP 2015-119713 obtained from https://worldwide.espacenet.com on Feb. 4, 2020, 31 pages.
Machine-assisted English translation of JP 2016-151010 obtained from https://worldwide.espacenet.com on Feb. 4, 2020, 25 pages.
Machine-assisted English translation of JP 2016-219738 obtained from https://worldwide.espacenet.com on Feb. 4, 2020, 34 pages.
Machine-assisted English translation of JP 2017-039802 obtained from https://worldwide.espacenet.com on Feb. 4, 2020, 45 pages.
Machine-assisted English translation of JP 2017-043717 obtained from https://worldwide.espacenet.com on Feb. 4, 2020, 18 pages.
English translation of JP2009209230A, obtained from https://patents.google.com/ on Oct. 19, 2022, 15 pages.

* cited by examiner

THERMALLY-CONDUCTIVE SILICONE GEL COMPOSITION, THERMALLY-CONDUCTIVE MEMBER, AND HEAT DISSIPATION STRUCTURE

CROSS-REFERENCE TO RELATED APPLICATIONS

This application is the National Stage of International Appl. No. PCT/JP2018/026226 filed on 11 Jul. 2018, which claims priority to and all advantages of Japanese Appl. No. 2017-142709 filed on 24 Jul. 2017, the content of which is hereby incorporated by reference.

TECHNICAL FIELD

The present invention relates to a thermally conductive silicone gel composition having a high thermal conductivity and an excellent gap filling ability and repairability, a thermally conductive member comprising the thermally conductive silicone gel composition, and a heat dissipation structure using the same.

BACKGROUND ART

In recent years, with an increase in the degree of density and integration of hybrid ICs and printed circuit boards that carry transistors, ICs, memory elements, and other electronic components, and an increase in the capacity of secondary batteries (cell type), the thermally conductive silicone compositions consisting of organopolysiloxane and thermally conductive fillers such as aluminum oxide powder and zinc oxide powder have been widely used in order to efficiently dissipate heat generated from electronic and electrical devices such as electronic components and batteries. In particular, the thermally conductive silicone composition filled with a large amount of thermally conductive fillers has been proposed in order to cope with high heat dissipation.

For example, Patent Documents 1 and 2 disclose that the thermally conductive silicone compositions having high thermal conductivity can be achieved by treating the surface of the thermally conductive filler with a hydrolyzable silane having a long-chain alkyl group, thereby imparting flexibility and heat-resistant mechanical properties to the molded product and improving its moldability and processability by decreasing the rise in viscosity, even if the thermally conductive silicone compositions are highly filled with the thermally conductive inorganic fillers.

However, in these thermally conductive silicone compositions, although a certain decrease in viscosity and improvement in moldability can be recognized, their fluidity is insufficient. Due to which it is difficult to precisely apply to the highly refined structures of electric and electronic materials, and sufficient heat dissipation may not be achieved where the gap is generated between the electronic members that are supposed to release heat, thereby causing latent heat. In addition, where these electronic members require repairability corresponding to positioning, circuit rearrangement, and the like, the conventional thermally conductive silicone composition makes it easy for the thermally conductive cured product to adhere to the member. Therefore, it is difficult to peel off the thermally conductive cured product from the member without leaving any residue, which may deteriorate the yield during manufacturing and may hinder repair or reuse of electronic and electrical devices such as electronic components and batteries.

PRIOR ART DOCUMENT

[Patent Document 1] JPH11-209618A
[Patent Document 2] JP2000-001616A

SUMMARY OF THE INVENTION

Problem to be Solved by the Invention

The present invention has been made in order to solve the above problems, and it is an object of the present invention to provide a thermally conductive silicone gel composition having excellent gap-filling ability and precision in application properties for electronic components having many gaps in order to maintain high fluidity of the entire composition even if the thermally conductive inorganic fillers are sufficiently filled; high peelability of the resulting thermally conductive cured product; and excellent repairability of a heat dissipation structure such as electronic and electrical devices. Further, since the resulting thermally conductive cured product is a soft gel composition, the damage to the member can be prevented by relieving the stress caused by the difference in the thermal expansion coefficient between the electronic component and the heat dissipation structure. Another object of the present invention is to provide a thermally conductive member using the thermally conductive silicone gel composition and a heat dissipation structure using the same.

Means for Solving the Problem

As a result of intensive studies, the present inventors found that the above problem can be solved by using a thermally conductive silicone gel composition comprising the following components (A) to (E). Thus, the present invention has been completed.

(A) 100 parts by mass of an alkenyl group-containing organopolysiloxane having a viscosity of 10 to 100,000 mPa·s at 25° C.;

(B) a straight-chain organohydrogenpolysiloxane containing an average of 2 to 4 silicon-bonded hydrogen atoms per molecule and having a viscosity of 1 to 1,000 mPa·s at 25° C., at least two of the hydrogen atoms being located on a side chain of the molecular chain, wherein the amount of silicon-bonded hydrogen atoms in the component (B) is from 0.2 to 5 mol per 1 mol of an alkenyl group contained in the component (A);

(C) a catalytic amount of a hydrosilylation reaction catalyst;

(D) 400 to 3,500 parts by mass of a thermally conductive filler; and (E) 0.1 to 2.0 mass % of an alkoxysilane having an alkyl group with 6 or more carbon atoms per molecule with respect to the component (D).

Further, the object of the present invention is suitably solved when the component (E) is an alkoxysilane represented by the following structural formula:

$$Y_n Si(OR)_{4-n}$$

(wherein Y is an alkyl group having 6 to 18 carbon atoms, R is an alkyl group having 1 to 5 carbon atoms, and n is a number of 1 or 2); particularly, when the component (E) is a trialkoxysilane having an alkyl group having 6 to 18 carbon atoms such as a decyl group.

The object of the present invention is suitably solved by a thermally conductive silicone gel composition, wherein the component (D) is surface treated with the component (E).

The object of the present invention is suitably solved by the thermally conductive silicone gel composition further comprising (F) a heat resistance imparting agent.

Similarly, the object of the present invention is suitably solved by the thermally conductive silicone gel composition, wherein the component (D) is (D1) a lamellar boron nitride powder having an average particle size of 0.1 to 30 μm; (D2) a granular boron nitride powder having an average particle size of 0.1 to 50 μm; (D3) a spherical and/or crushed aluminum oxide powder having an average particle size of 0.01 to 50 μm; or (D4) a graphite having an average particle size of 0.01 to 50 μm; or a mixture of two or more types thereof.

Similarly, the object of the present invention is suitably solved by the composition, wherein the component (B) is (B1) a straight-chain organohydrogenpolysiloxane containing an average of 2 to 3 silicon-bonded hydrogen atoms per molecule, at least two of the hydrogen atoms being located on a side chain of the molecular chain; particularly, it is more preferable that the component (B) is a straight-chain organohydrogenpolysiloxane having an average of two silicon-bonded hydrogen atoms only on the side chain of the molecular chain. Furthermore, the content of the silicon-bonded hydrogen atoms in the component (B) ([HB]) and the content of the silicon-bonded hydrogen atoms in organohydrogenpolysiloxane other than component (B) ([Hnon-B]) in the composition, i.e., the value of [Hnon-B]/([HB]+[Hnon-B]), is preferably in the range from 0.0 to 0.70. The value may be from 0.0 to 0.50, 0.0 to 0.25, and 0.0.

Furthermore, the object of the present invention is suitably solved by a thermally conductive member comprising these thermally conductive silicone gel compositions, particularly a thermally conductive member obtained by curing the thermally conductive silicone gel composition. The object of the present invention is also suitably solved by a heat dissipation structure comprising these thermally conductive members.

The heat dissipation structure is not particularly limited but is preferably an electric/electronic component or a secondary battery, an electric/electronic device and the like. For a fine heat dissipation structure, a desired BLT (Bond Line Thickness) may be designed and applied.

Effects of the Invention

The present invention provides a thermally conductive silicone gel composition having excellent gap filling ability and precision in application properties for electronic components having many gaps in order to maintain high fluidity of the entire composition even if the thermally conductive inorganic fillers are sufficiently filled; high peelability of the resulting thermally conductive cured product; and excellent repairability of the electronic components. Further, since the resulting thermally conductive cured product is a soft gel composition, the damage to the member can be prevented by relieving the stress caused by the difference in the thermal expansion coefficient between the electronic component and the heat dissipation structure. The present invention also provides a thermally conductive member using the thermally conductive silicone gel composition and a heat dissipation structure using the same member (particularly, the heat dissipation structure of electric and electronic devices, including the heat dissipation structure of electric and electronic components and the heat dissipation structure of secondary batteries).

MODE FOR CARRYING OUT THE INVENTION

[Thermally Conductive Silicone Gel Composition]

The composition according to the present invention contains each of (A) an alkenyl group-containing organopolysiloxane having a viscosity of 10 to 100.000 mPa·s at 25° C.; (B) a straight-chain organohydrogenpolysiloxane containing an average of 2 to 4 silicon-bonded hydrogen atoms per molecule and having a viscosity of 1 to 1,000 mPa·s at 25° C., at least two of the hydrogen atoms being located on a side chain of the molecular chain; (C) a hydrosilylation reaction catalyst; (D) thermally conductive filler; and (E) an alkoxysilane having an alkyl group with 6 or more carbon atoms per molecule, in a specific amount. Optionally, (F) a heat resistance-imparting agent and other additives can also be added. Hereinafter, each component will be described.

[(A) Alkenyl Group-Containing Organopolysiloxane]

The component (A) alkenyl group-containing organopolysiloxane is a main component of the thermally conductive silicone gel composition and has a viscosity in the range from 10 to 100,000 mPa·s at 25° C. The viscosity of the component (A) at 25° C. is preferably in the range from 10 to 100,00 mPa·s, and more preferably in the range from 10 to 10,000 mPa·s. When the viscosity of the component (A) is less than 10 mPa·s, the physical properties of the obtained silicone gel tend to decrease. When the viscosity of the component (A) exceeds 100,000 mPa·s, the handleability and gap filling ability of the obtained silicone gel composition tend to decrease.

Component (A) is constituted of one or two or more types of alkenyl group-containing organopolysiloxanes. The molecular structure of such an alkenyl group-containing organopolysiloxane is not particularly limited, and examples include linear, branched, cyclic, and three-dimensional network structures, and combinations thereof. Component (A) may be made up of only linear alkenyl group-containing organopolysiloxanes, only alkenyl group-containing organopolysiloxanes having a branched structure, or mixtures of linear organopolysiloxanes and alkenyl group-containing organopolysiloxanes having a branched structure. Examples of the alkenyl group in the molecule include a vinyl group, an allyl group, a butenyl group, and a hexenyl group. Examples of the organic group other than the alkenyl group in the component (A) include an alkyl group such as a methyl group, an ethyl group, and a propyl group; an aryl group such as a phenyl group and a tolyl group; a monovalent hydrocarbon group other than alkenyl groups such as a halogenated alkyl group such as 3,3,3-trifluoropropyl group.

The component (A) is particularly preferably a linear alkenyl group-containing organopolysiloxane, which preferably has an alkenyl group on at least both ends of its molecular chain, and may have an alkenyl group only on both ends of its molecular chain. Such component (A) is not particularly limited, but examples include dimethylpolysiloxane capped at both ends of the molecular chain by dimethylvinylsiloxy groups, copolymers of dimethylsiloxane and methylphenylsiloxane capped at both ends of the molecular chain by dimethylvinylsiloxy groups, copolymers of dimethylsiloxane and methylvinylsiloxane capped at both ends of the molecular chain by trimethylsiloxy groups, copolymers of dimethylsiloxane, methylvinylsiloxane and methylphenylsiloxane capped at both ends of the molecular chain by trimethylsiloxy groups, copolymers of dimethylsiloxane and methylvinylsiloxane capped at both ends of the molecular chain by silanol groups, polymers in which some of the methyl groups in these polymers are substituted by alkyl groups other than methyl groups, such as ethyl groups or propyl groups, or halogenated alkyl groups such as 3,3,3-trifluoropropyl groups, polymers in which vinyl groups in these polymers are substituted by alkenyl groups other than vinyl groups, such as allyl groups, butenyl groups or hexenyl groups, and mixtures of two or more of these polymers. Note that, in these alkenyl group-containing organopolysiloxanes, it is preferable that the low molecular weight siloxane oligomers (octamethyltetrasiloxane (D4), decamethylpentasiloxane (D5)) are reduced or removed from the viewpoint of preventing contact failure.

The component (A) of the present invention may further have an alkoxysilyl-containing group represented by the general formula, bonded to silicon atoms:

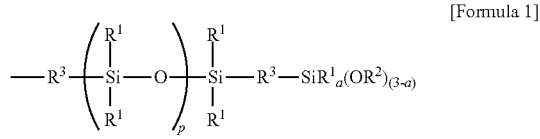

[Formula 1]

(wherein, $R^1$ is the same or different monovalent hydrocarbon group having no aliphatic unsaturated bond; $R^2$ is an alkyl group, $R^3$ is the same or different alkylene group, a is an integer of 0 to 2, and p is an integer of 1 to 50). The organopolysiloxane having these functional groups suppresses the thickening of the composition in an uncured state and has an alkoxysilyl group in the molecule; and, therefore, it also functions as a surface treatment agent for component (D). For this reason, the thickening and oil bleeding of the obtained composition are suppressed, and handleability is not impaired.

[(B) Organohydrogenpolysiloxane]

Component (B) is one of the characteristic components of the present invention, and is a straight-chain organohydrogenpolysiloxane containing an average of 2 to 4 silicon-bonded hydrogen atoms per molecule and having a viscosity of 1 to 1,000 mPa·s at 25° C., at least two of the hydrogen atoms being located on a side chain of the molecular chain. Having such a structure means that the component (B) functions as a crosslinking extender in the composition by a hydrosilylation reaction of silicon-bonded hydrogen atoms on a side chain of the molecular chain.

The component (B) functions as a crosslinking extender of the component (A) in the thermally conductive silicone gel composition of the present invention, and gradually crosslinks the entire composition to form a gel-like cured product. Here, the component (B) has on average at least two silicon-bonded hydrogen atoms on the side chain of the molecular chain, and an average of 2 to 4 silicon-bonded hydrogen atoms per molecule. Therefore, the cross-linking ex-tension reaction progresses mainly by 2 to 4 silicon-bonded hydrogen atoms on the side chain, thereby forming a thermally conductive silicone gel cured product with excellent peelability from members and excellent repairability such as repair and reuse.

From the viewpoint of improving peelability and repairability, the component (B) is preferably (B1) a straight-chain organohydrogenpolysiloxane containing an average of 2 to 3 silicon-bonded hydrogen atoms per molecule, at least two of the hydrogen atoms being located on a side chain of the molecular chain, and particularly preferably is (B1-1) an organohydrogenpolysiloxane having an average of 2 to 3 silicon-bonded hydrogen atoms only in the side chain of the molecular chain. Note that, most preferably, on average there are only 2 silicon-bonded hydrogen atoms in component (B) only on the side chain of the molecular chain.

With regards to the component (B) in the composition of the present invention, the amount of silicon-bonded hydrogen atoms in the component (B) must be at least in the range of from 0.2 to 5 mol per 1 mol of an alkenyl group contained in the component (A); and particularly preferably in the range of from 0.3 to 2.0 mol, or 0.4 to 1.0 mol from the viewpoint of the formation of the obtained thermally conductive silicone gel cured product and the peelability and repairability of the cured product. Specifically, in the case where there is no organohydrogenpolysiloxane other than the component (B) in the composition, if the content of the silicon-bonded hydrogen atoms in the component (B) is less than the lower limit of the above range, the resulting thermally conductive silicone gel composition will not sufficiently cure; whereas if the upper limit of the above range is exceeded, the amount of silicon-bonded hydrogen atoms becomes excessive, thereby impairing the peelability and repairability of the cured product.

Examples of such a component (B) include copolymers of methylhydrogensiloxane and dimethylsiloxane capped at both ends of the molecular chain by trimethylsiloxy groups, copolymers of methylhydrogensiloxane and dimethylsiloxane capped at both ends of the molecular chain by dimethylhydrogensiloxy groups, and the like. Note that, these examples are not limited, and a part of the methyl group may be substituted with a phenyl group, a hydroxyl group, an alkoxy group, or the like.

The viscosity of the component (B) at 25° C. is not particularly limited, but is preferably in the range of from 1 to 500 mPa·s. Further, from the viewpoint of preventing contact failure or the like, it is preferable that low-molecular-weight siloxane oligomers (octamethyltetrasiloxane (D4) and decamethylpentasiloxane (D5)) are reduced or removed.

[Use of Other Crosslinking Agents in Combination]

The composition of the present invention may contain an organohydrogenpolysiloxane other than component (B), as a crosslinking agent. Example thereof include copolymers of methylhydrogensiloxane and dimethylsiloxane capped at both ends of the molecular chain by trimethylsiloxy groups, having on average more than 4 silicon-bonded hydrogen atoms per molecule; copolymers of methylhydrogensiloxane and dimethylsiloxane capped at both ends of the molecular chain by dimethylhydrogensiloxy groups, having on average more than 4 silicon-bonded hydrogen atoms per molecule; methylhydrogen polysiloxane capped at both ends of the molecular chain by trimethylsiloxy groups; dimethylpolysiloxane capped at both ends of the molecular chain by dimethylhydrogensiloxy groups; siloxane resin containing methyl hydrogensiloxy groups; and the like. However, it is necessary to include at least the above amount of component (B) as a crosslinking extender. Even when other organohydrogenpolysiloxanes are used in combination, the ratio of the component (B) is preferably over a definite amount from the viewpoint of the curing properties of the composition of the present invention and the peelability and repairability of the cured product. Also, the number (average value) of silicon-bonded hydrogen atoms of these organohydrogenpolysiloxanes per molecule is preferably not more than eight.

Specifically, the content of the silicon-bonded hydrogen atoms in the component (B) ($[H_B]$) and the content of the silicon-bonded hydrogen atoms in organohydrogenpolysiloxane other than component (B) ($[H_{non-B}]$) in the composition, i.e., the value of $[H_{non-B}]/([H_B]+[H_{non-B}])$ is preferably in the range from 0.0 to 0.70. The value may be from 0.0 to 0.50, 0.0 to 0.25, and 0.0. When the value of $[H_{non-B}]/([H_B]+[H_{non-B}])$ exceeds the upper limit of the above range, the effect of the component (B) in the entire cross-linking agent in the composition becomes relatively small, the peelability and repairability of the cured product may be impaired, and the resulting composition may not sufficiently cure.

From the viewpoint of the technical effects of the present invention, the following combinations of organohydrogenpolysiloxanes are preferred as crosslinking agents in the composition.

(B'1): Only component (B), or substantially only component (B) with no other organohydrogenpolysiloxane intentionally blended in the composition (B'2): In addition to the component (B1), A mixture of organohydrogenpolysiloxane containing one or two or more selected from dimethylpolysiloxane capped at both ends of the molecular chain by dimethylhydrogensiloxy groups copolymers of methylhydrogensiloxane and dimethylsiloxane capped at both ends of the molecular chain by trimethylsiloxy groups, having on average 5 to 8 silicon-bonded hydrogen atoms per molecule, and copolymers of methylhydrogensiloxane and dimethylsiloxane capped at both ends of the molecular chain by dimethylhydrogensiloxy groups, having on average 5 to 8 silicon-bonded hydrogen atoms per molecule.

However, the value of [Hnon-B]/([HB]+[Hnon-B]) is preferably in the same range as the aforementioned even if the above component (B'2) is used.

[Amount of Organohydrogenpolysiloxane (Crosslinking Agent) in Composition]

The content of the organohydrogenpolysiloxane in the composition including the component (B) is such that the amount of silicon-bonded hydrogen atoms in the organohydrogenpolysiloxane is from 0.2 to 5 mol per 1 mol of the alkenyl group contained in the component (A) in the composition, and particularly preferably in the range of from 0.3 to 2.0 mol, or 0.4 to 1.0 mol from the viewpoint of the formation of the obtained thermally conductive silicone gel cured product and the peelability and repairability of the cured product.

In particular, when the organohydrogenpolysiloxane in the composition is a mixture represented by the above (B'2), particularly a mixture of the component (B) and the dimethylpolysiloxane capped at both ends of the molecular chain by dimethylhydrogensiloxy groups, the amount of the silicon-bonded hydrogen atoms in the organohydrogenpolysiloxane is preferably from 0.5 to 1.5 mol, more preferably in the range of from 0.7 to 1.0 mol from the viewpoint of improving the curability of the composition. On the other hand, when the organohydrogenpolysiloxane in the composition is substantially only the component (B), the amount of the silicon-bonded hydrogen atoms in the organohydrogenpolysiloxane is preferably from 0.3 to 1.5 mol and more preferably in the range of from 0.4 to 1.0 mol. When the type and content of the organohydrogenpolysiloxane in the composition are within the above range, the technical effects of the present invention, i.e. the gap filling ability and the fluidity of the thermally conductive silicone gel composition are excellent, and the physical properties, particularly the peelability and the repairability, of the resulting thermally conductive silicone gel cured product are the most satisfactory.

[(C) Hydrosilylation Reaction Catalyst]

Examples of the hydrosilylation reaction catalyst include a platinum-based catalyst, a rhodium-based catalyst, and a palladium-based catalyst. Platinum-based catalysts are preferred because they are able to significantly accelerate the curing of the composition. Examples of the platinum-based catalysts include fine platinum powder, chloroplatinic acid, alcohol solutions of chloroplatinic acid, platinum-alkenyl siloxane complexes, platinum-olefin complexes, platinum-carbonyl complexes, and catalysts in which these platinum-based catalysts are dispersed or encapsulated in thermoplastic resins such as silicone resins, polycarbonate resins, and acrylic resins. Platinum-alkenyl siloxane complexes are especially preferred. Examples of the alkenyl siloxane include 1,3-divinyl-1,1,3,3-tetramethyldisiloxane, 1,3,5,7-tetramethyl-1,3,5,7-tetravinylcyclotetrasiloxane, alkenyl siloxanes in which some of the methyl groups in the alkenyl siloxane have been substituted with ethyl groups and phenyl groups, and alkenyl siloxanes in which the vinyl groups in the alkenyl siloxane have been substituted with allyl groups and hexenyl groups. Since the stability of the platinum-alkenyl siloxane complexes is especially good, 1,3-divinyl-1,1,3,3-tetramethyldisiloxane is preferred. In addition, from the viewpoint of improving the handleability and the pot life of the composition, a platinum-containing hydrosilylation reaction catalyst in which particulates are dispersed or encapsulated in a thermoplastic resin may also be used. Note that a non-platinum-based metal catalyst such as iron, ruthenium, and iron/cobalt may be used as a catalyst for promoting a hydrosilylation reaction.

The added quantity of the hydrosilylation reaction catalyst is a catalytic amount. The amount of the hydrosilylation reaction catalyst with respect to the component (A) is preferably in the range from 0.01 to 500 ppm, 0.01 to 100 ppm, or 0.01 to 50 ppm in terms of mass units of metal atoms.

[Hydrosilylation Reaction Inhibitor]

The composition of the present invention further preferably contains a hydrosilylation reaction inhibitor from the viewpoint of handleability. The hydrosilylation reaction inhibitor is a component for inhibiting a hydrosilylation reaction of the thermally conductive silicone gel composition of the present invention. Specific examples of which include acetylene-based reaction inhibitors such as ethynylcyclohexanol, and amine-based, carboxylic acid ester-based, phosphite ester-based reaction inhibitors. The added quantity of reaction inhibitors is normally from 0.001 to 5 mass % of the total silicone gel composition. In particular, with the object of improving handleability of the silicone gel composition, acetylene-based compounds such as 3-methyl-1-butyn-3-ol, 3,5-dimethyl-1-hexyn-3-ol, and 3-phenyl-1-butyn-3-ol; enyne compounds such as 3-methyl-3-penten-1-yne and 3,5-dimethyl-3-hexen-1-yne; cycloalkenylsiloxanes such as 1,3,5,7-tetramethyl-1,3,5,7-tetravinylcyclotetrasiloxane and 1,3,5,7-tetramethyl-1,3,5,7-tetrahexenylcyclotetrasiloxane; and triazole compounds such as benzotriazole may be used without particular limitation.

[(D) Thermally Conductive Filler]

The component (D) is a thermally conductive filler for imparting thermal conductivity to the composition and a thermally conductive member obtained by curing the composition. Such a component (D) is preferably at least one or more type of powder and/or fiber selected from the group consisting of a pure metal, alloy, metal oxide, metal hydroxide, metal nitride, metal carbide, metal silicide, carbon, soft magnetic alloy and a ferrite. Metal powder, metal oxide powder, metal nitride powder, or carbon powder is preferred.

All or a part of the thermally conductive filler is preferably subjected to a surface treatment with an alkoxysilane as a component (E) described later. Furthermore, those powders and/or fibers which have been treated with various surface treatment agents known as coupling agents may be used separately or together with the component (E). Examples of the a surface treatment agent for treating the powder and/or fiber of the component (D) include surfactants, other silane coupling agents, aluminum-based coupling agents, silicone-based surface treatment agents, and the like, in addition to component (E).

Examples of pure metals include bismuth, lead, tin, antimony, indium, cadmium, zinc, silver, copper, nickel, aluminum, iron and metallic silicon. Examples of the alloy include an alloy consisting of two or more metals selected from the group consisting of bismuth, lead, tin, antimony, indium, cadmium, zinc, silver, aluminum, iron and metallic silicon. Examples of the metal oxide include alumina, zinc oxide, silicon oxide, magnesium oxide, beryllium oxide, chromium oxide, and titanium oxide. Examples of metal hydroxide include magnesium hydroxide, aluminum hydroxide, barium hydroxide, and calcium hydroxide. Examples of metal nitride include boron nitride, aluminum nitride and silicon nitride. Examples of metal carbide include silicon carbide, boron carbide and titanium carbide. Examples of metal silicide include magnesium silicide, titanium silicide, zirconium silicide, tantalum silicide, niobium silicide, chromium silicide, tungsten silicide, and molybdenum silicide. Examples of the carbon include diamond, graphite, fullerene, carbon nanotube, graphene, activated carbon, and monolithic carbon black. Examples of soft magnetic alloy include an Fe—Si alloy, Fe-Al alloy, Fe—Si-Al alloy, Fe—Si—Cr alloy, Fe—Ni alloy, Fe—Ni—Co alloy, Fe—Ni—Mo alloy, Fe—Co alloy, Fe—Si-Al-Cr alloy, Fe—Si—B alloy and an Fe—Si—Co—B alloy. Examples of ferrite include a Mn—Zn ferrite, Mn—Mg—Zn ferrite, Mg—Cu—Zn ferrite, Ni—Zn ferrite, Ni—Cu—Zn ferrite and a Cu—Zn ferrite.

Note that the component (D) is preferably a silver powder, aluminum powder, aluminum oxide powder, zinc oxide powder, aluminum nitride powder or graphite. When the composition requires electrical insulation, a metal oxide-based powder or a metal nitride-based powder is preferably used; particularly preferably an aluminum oxide powder, a zinc oxide powder, or an aluminum nitride powder.

The form of the component (D) is not particularly limited, and examples thereof include spherical, needle-like, disk-like, rod-like, or irregular form, preferably spherical or irregular form. The average particle size of component (D) is not particularly limited but is preferably in the range of 0.01 to 100 and more preferably in the range of 0.01 to 50 µm.

The component (D) is particularly preferably (D1) a lamellar boron nitride powder having an average particle size of 0.1 to 30 (D2) a granular boron nitride powder having an average particle size of 0.1 to 50 (D3) a spherical and/or crushed aluminum oxide powder having an average particle size of 0.01 to 50 or (D4) a spherical and/or crushed graphite having an average particle size of 0.01 to 50 µm; or a mixture of two or more types thereof. A mixture of two or more types of spherical and crushed aluminum oxide powders having an average particle size of 0.01 to 50 µm is most preferred. Combination of an aluminum oxide powder having a larger particle size with an aluminum oxide powder having a smaller particle size in a proportion according to a closest packing theory distribution curve can especially improve the filling efficiency, reduce the viscosity and increase the thermal conductivity.

The content of the component (D) is in the range of from 400 to 3,500 parts by mass, preferably in the range of 400 to 3,000 parts by mass, per 100 parts by mass of the component (A). This is because the thermal conductivity of the obtained composition tends to be insufficient if the content of the component (D) is lower than the lower limit of the aforementioned range, and if the content of the component (D) exceeds the upper limit of the aforementioned range, the viscosity of the obtained composition significantly increases even when the component (E) is blended or used for the surface treatment of the component (D), and hence, the handleability, the gap filling ability and the like tend to deteriorate.

[(E) Alkyl Alkoxysilane]

The component (E) is a characteristic component of the composition together with the component (B), and is an alkoxysilane having an alkyl group having 6 or more carbon atoms per molecule. Here, the specific examples of the alkyl group having 6 or more carbon atoms include an alkyl group such as hexyl group, octyl group, dodecyl group, tetradecyl group, hexadecyl group, and octadecyl group, and an aralkyl group such as benzyl group and phenylethyl group. The alkyl group having 6 to 20 carbon atoms is particularly preferred. In the case of an alkoxysilane having an alkyl group having less than 6 carbon atoms, the effect of reducing the viscosity of the composition is insufficient, so the viscosity of the composition may increase and the desired fluidity and gap filling ability may not be achieved. Further, when an alkoxysilane having an alkyl group having 20 or more carbon atoms is used, the compatibility may deteriorate depending on the type of the component (A) in addition to being inferior in industrial suppliability.

The component (E) is preferably an alkoxysilane represented by the following structural formula:

(wherein Y is an alkyl group having 6 to 18 carbon atoms, R is an alkyl group having 1 to 5 carbon atoms, and n is a number of 1 or 2). Examples of the OR group include a methoxy group, ethoxy group, propoxy group and a butoxy group; particularly preferably a methoxy group and an ethoxy group. 'n' is 1, 2 or 3; particularly preferably 1.

Such a component (E) is specifically $C_6H_{13}Si(OCH_3)_3$, $C_8H_{17}Si(OC_2H_5)_3$, $C_{10}H_{21}Si(OCH_3)_3$, $C_{11}H_{23}Si(OCH_3)_3$, $C_{12}H_{25}Si(OCH_3)_3$, $C_{14}H_{29}Si(OC_2H_5)_3$, and the like; most preferably decyl trimethoxysilane.

The amount of the component (E) used is from 0.1 to 2.0 mass % relative to the component (D). If the amount is less than the lower limit of the aforementioned range, the effect of reducing the viscosity of the composition may be insufficient. If the amount of the component (E) used exceeds the upper limit of the aforementioned range, the effect of reducing the viscosity may be saturated, and the alkoxysilane may be further separated, resulting in reduced storage stability of the composition.

In the present invention, the component (E) is preferably blended in the form such that the component (D) is surface treated with the component (E). It is particularly preferred that at least a part of the component (D) is surface treated with the component (E) from the viewpoint of improving the fluidity and gap filling ability of the composition. When the component (E) is used as a surface treatment agent, the amount thereof is preferably from 0.15 to 1.2 mass %, more preferably from 0.2 to 1.0 mass % relative to the component (D).

The surface treatment method using the component (E) is not particularly limited, but a direct treatment method for the thermally conductive inorganic filler, i.e. the component (D), an integral blend method, a dry concentrate method, and the like may be used. The direct treatment method includes a dry method, a slurry method, a spray method, and the like. The integral blend method includes a direct method, a master batch method, and the like. From amongst these, the dry method, the slurry method, and the direct method are often used. Preferably, the total amount of the component (D) and the component (E) may be mixed beforehand using a known mixing device, and the surface thereof may be treated. Note that, as described in Patent Documents 1 and 2, a part of the component (E) may form a hydrolyzate or a polymer on the surface of the component (D), which is included in the concept of the surface treatment in the present invention.

The aforementioned mixing device is not particularly limited, and examples thereof include a single-shaft or twin-shaft continuous mixer, twin roller, Ross mixer, Hobart mixer, dental mixer, planetary mixer, kneader mixer, Henschel mixer and the like.

[Component (F)]

The composition of the present invention comprises the aforementioned components (A) to (E), and optionally other crosslinking agents and hydrosilylation reaction inhibitors. The composition of the present invention preferably further contains (F) a heat resistance imparting agent from the viewpoint of improving the heat resistance of the thermally conductive silicone gel composition and the cured product thereof. The component (F) is not particularly limited provided that it can impart heat resistance to the composition of the present invention and the cured product thereof. Examples thereof include metal oxides such as iron oxide, titanium oxide, cerium oxide, magnesium oxide, aluminum oxide and zinc oxide; metal hydroxides such as cerium hydroxide; phthalocyanine compounds; carbon black; cerium silanolate; cerium fatty acid salts; reaction products of organopolysiloxanes and cerium carboxylates. Phthalocyanine compound is particularly preferred, for example, an additive selected from the group consisting of a metal-free phthalocyanine compound and a metal-containing phthalocyanine compound disclosed in JP2014-503680A is preferably used, and among the metal-containing phthalocyanine compounds, a copper phthalocyanine compound is particularly preferred. An example of the most preferable and non-limiting heat-resistance-imparting agent is 29H, 31H-phthalocyaninato (2-)-N29, N30, N31, N32 copper. Such phthalocyanine compounds are commercially available, for example, Stan-tone™ 40SP03 from PolyOne Corporation (Avon Lake, Ohio, USA).

The amount of the component (F) may be in the range of from 0.01 to 5.0 mass % of the total composition. It may be in the range of from 0.05 to 0.2 mass % and 0.07 to 0.1 mass %.

[Other Additives]

Other than the above components, optional components may be blended in the thermally conductive silicone gel composition of the present invention within a range such that the object of the present invention is not impaired. Examples of the optional components include inorganic fillers (also referred to as "inorganic filling materials") such as fumed silica, wet silica, crushed quartz, titanium oxide, magnesium carbonate, zinc oxide, iron oxide, diatomaceous earth, and carbon black; inorganic fillers obtained by hydrophobic treatment of the surface of such inorganic fillers by organosilicon compounds; organopolysiloxanes not containing silicon-bonded hydrogen atoms or silicon-bonded alkenyl groups, heat resistance-imparting agents, cold resistance-imparting agents, thermally conductive fillers, flame retarders, thixotropy-imparting agents, pigments, dyes, and the like. In addition, the thermally conductive silicone gel composition of the present invention may include, if desired, at least one type of antistatic agent comprising a known adhesion-imparting agent, a cationic surfactant, an anionic surfactant, or a nonionic surfactant; dielectric filler; electrically conductive filler; release component; thixotropy-imparting agents; antifungal agent; and the like. If desired, an organic solvent may also be added.

[Method for Preparing the Composition]

The thermally conductive silicone gel composition of the present invention can be prepared by mixing each of the above components. For example, it can be prepared by mixing the components (D) and (E) in advance, then treating the surface of the component (D) with the component (E), and then mixing the remaining components (A) to (C), the component (F), and other optional components. Alternatively, the composition can be prepared by mixing components (D) and (E) with the component (A), then treating the surface of the component (D) with the component (E), and then mixing the remaining components (B), (C), and (F), and other optional components. The method for mixing each component may be a conventionally known method, and is not particularly limited. However, mixing the component using a mixing device is usually preferred because a uniform mixture can be obtained by simple stirring. Such a mixing device is not particularly limited, and examples thereof include a single-shaft or twin-shaft continuous mixer, twin roller, Ross mixer, Hobart mixer, dental mixer, planetary mixer, kneader mixer, Henschel mixer and like.

[Composition Form and Package]

The thermally conductive silicone gel composition of the present invention may be used as a one-component type composition (including one-pack type) or, if necessary, as a multi-component type composition (including multi-pack type, especially two-pack type) in which the separated multi-components are mixed at the time of use. In the case of the one-component type, each component of the composition may be used by putting in a single storage container. In the case of the multi-component type, a plurality of separately stored compositions may be mixed and used in a predetermined ratio. Note that, these packages are not particularly limited and may be selected as desired according to a curing method, a coating mean, and an application item to be described later.

[Thermally Conductive Silicone Gel Composition]

The thermally conductive silicone gel composition of the present invention has excellent fluidity, can be applied precisely, and has excellent gap filling ability. Specifically, the viscosity of the composition before curing is in the range of from 10 to 500 Pa·s at 25° C., and more preferably from 50 to 400 Pa·s.

The thermally conductive silicone gel composition of the present invention is cured by a hydrosilylation reaction to form a silicone gel cured product having excellent thermal conductivity. The temperature for curing this hydrosilylation reaction-curable silicone gel composition is not particularly limited, but is normally in the range of from 20° C. to 150° C., and more preferably in the range of from 20 to 80° C.

The silicone gel cured product of the present invention preferably has a hardness that satisfies the range of from 2 to 70 and more preferably satisfies the range of from 2 to 50; the hardness is measured with a type E durometer described in JIS K6249. The product showing a hardness of 70 are has a hardness less than or equal to 50 as measured with a type A durometer generally used for elastomer applications. Therefore, the silicone gel cured product having hardness in such a range has characteristics of a silicone gel such as a low elastic modulus and a low stress. On the other hand, if the hardness is greater than 70, the adhesion to the heat generating member is excellent, but the followability may be deteriorated. If the hardness is less than 2, the followability is excellent, but the fixability of the heat generating member may be deteriorated.

[Thermal Conductivity]

The thermally conductive silicone gel composition of the present invention can stably and highly fill with thermally conductive fillers, such that the compositions and the silicone gel cured products of 2.0 W/mK or more, preferably 3.0 W/mK or more, and more preferably 3.0 to 7.0 W/mK may be designed.

[Use and Heat Dissipation Structure]

The thermally conductive silicone gel composition of the present invention is useful as a heat transfer material (thermally conductive member) which is interposable at an interface between the thermal interfaces of a heat generating component and a heat dissipation member, such as a heat sink or circuit board, for conductive cooling of the heat generating component, and can form a heat dissipation structure comprising the same. Here, the type, size, and the detailed structure of the heat generating component are not particularly limited, but the thermally conductive silicone gel composition of the present invention has excellent gap filling ability to a member while having high thermal conductivity, has high adhesion and followability even to the heat generating member having fine irregularities and a narrow gap structure, and has the flexibility inherent to gel. Therefore, the thermally conductive silicone gel composition can be suitably applied to a heat dissipation structure of electric/electronic devices including electric/electronic components or cell type secondary batteries.

Electric/electronic devices comprising the member consisting of the above thermally conductive silicone composition are not particularly limited. Examples thereof include secondary batteries such as cell-type lithium-ion electrode secondary batteries and cell-stacked fuel cells; electronic circuit boards such as printed circuit boards; IC chip packaged with an optical semiconductor device such as a diode (LED), an organic electroluminescent element (organic EL), a laser diode, and an LED array; CPU used in electronic devices such as personal computers, digital video discs, mobile phones, and smartphones; LSI chips such as driver ICs and memories; and the like. Particularly, in high performance digital switching circuits formed with high integration density, heat removal (heat dissipation) becomes a key factor in the performance and reliability of integrated circuits. However, the thermally conductive member using the thermally conductive silicone gel composition according to the present invention has excellent heat dissipation and handleability even when it is applied to power semiconductor applications such as engine control, power train system and air conditioner control in air transport; and has excellent heat resistance and thermal conductivity even when used in a harsh environment built into an in-vehicle electronic part such as an electronic control unit (ECU). Further, the thermally conductive silicone gel composition according to the present invention may be disposed not only on a horizontal surface but also on a vertical surface by controlling the rheology thereof, and it may also penetrate into the microstructure of the heat generating components, such as electric/electronic components or secondary batteries, to provide a heat dissipation structure without gaps. Thus, the heat dissipation of electric/electronic devices comprising the heat dissipation structure can be improved; the problem of latent heat and thermal runaway can be improved as well as a flexible gel-like cured product can protect a substructure of electric/electronic devices, thereby improving its reliability and operational stability.

Examples of the material constituting the above electric/electronic devices include resin, ceramic, glass, and metal such as aluminum. The thermally conductive silicone gel composition of the present invention can be applied to the substrates thereof both as a thermally conductive silicone gel composition (fluid) before curing and as a thermally conductive silicone cured product.

[Curing Method]

For heat generating components, the method of forming a heat dissipation structure using the thermally conductive silicone gel composition of the present invention is not limited, and example includes a method of curing the composition by pouring the thermally conductive silicone gel composition of the present invention into the heat dissipation parts for electric/electronic components, to sufficiently fill the gaps, and then it is heated and left at room temperature.

In applications where rapid curing is required, a method of heating and curing is particularly preferable since the entire material can be cured relatively quickly. At this time, increase in the heating temperature promotes the generation of bubbles and cracks in the sealing agent for the electric/electronic components that are being sealed or filled. Therefore, the heating is preferably performed within the range of from 50 to 250° C.; particularly preferably within the range of from 70 to 130° C. In the case of thermal curing, the composition may be formed into a one-pack type package. In this case, from the viewpoint of improving the handleability and the pot life of the composition, a platinum-containing hydrosilylation reaction catalyst in which particulates are dispersed or encapsulated in a thermoplastic resin may be used, and is preferable.

The thermally conductive silicone gel composition of the present invention may be cured under heating at room temperature or at 50° C. or lower. In this case, the composition may be formed into a one-pack type or multi-pack type package. And, after mixing, it is preferable to cure the composition under heating at room temperature or 50° C. or lower over 1 hour to several days.

The form, thickness and arrangement of the thermally conductive silicone gel obtained by the above curing can be designed as desired. It may be cured if necessary after filling in the gaps of electric/electronic devices and it may be applied or cured on a film provided with a release layer (separator), and may be handled alone as a thermally conductive silicone gel cured product on the film. Further, in that case, a form of a thermally conductive sheet reinforced by a known reinforcing material may be used.

[Specific Examples of Electric/Electronic Device]

The thermally conductive silicone gel composition of the present invention has excellent gap filling ability and forms a gel-like thermally conductive member having excellent flexibility and thermal conductivity. Therefore, it is also effective for those having narrow gaps between electrical elements and packages, between electrical elements and between electrodes in electric/electronic components, and those having a structure in which above structures are difficult to follow the expansion and contraction of the silicone gel. For example, it can also be used for semiconductor devices such as secondary batteries, ICs, hybrid ICs, and LSIs; electric circuits and modules in which such a semiconductor devices, capacitor, electric resistor and other electric elements are mounted; various sensors such as pressure sensors; igniters and regulators for automobiles, power generation systems, or power devices such as space transportation systems.

Examples

The present invention will now be described with reference to examples, but the present invention is not limited thereto.

The components (A) to (E) were mixed as follows to obtain thermally conductive silicone gel compositions of Examples 1 to 6 and Comparative Examples 1 to 7.

The components (A), (D) and (E) were mixed in the number of parts as shown in Tables 1 to 3 (Examples 1 to 6 and Comparative Examples 1 to 7), and further mixed at 160° C. for 1 hour under reduced pressure. The resulting mixture was cooled to a normal temperature. After cooling, the components (B), (C) and other components shown in the table were added and uniformly mixed.

[Preparing a Thermally Conductive Silicone Gel Cured Product]

A 12 mm high, 50 mm long, and 30 mm wide frame was made using a polyethylene backer on a polypropylene sheet, and filled with the obtained composition. A Teflon (registered trademark) sheet was pressed on the frame so as to form a smooth surface. This was then cured as is for 1 day in an atmosphere of 25° C. After curing, the Teflon (registered trademark) sheet and the polyethylene backer were removed to obtain a thermally conductive silicone gel cured product.

The thermally conductive silicone gel composition obtained by the number of parts shown in Examples 1 to 6 and Comparative Examples 1 to 7 contains the component (D) so as to obtain a thermal conductivity of 3.5 W/mK. This thermal conductivity is measured by a probe method using QTM-500 manufactured by Kyoto Electronics Industry Co., Ltd.

The test concerning the effect relating to the present invention was performed as follows. The results are shown in Tables 1 to 3.

[Hardness]

Hardness was measured using an ASKER TYPE E durometer manufactured by ASKER.

[Compression Deformation]

The compression deformation rate was measured by using TA. XT. plus Texture Analyzer by manufactured by Stable Micro Systems. A stress of 10 N was applied on the specimen at a rate of 0.5 mm/sec and held for 10 seconds. The value of the deformation rate was read for a 12-mm thick test specimen when the 10N stress was reached. The probe used had a diameter of 1.27 cm, and the starting position of the test was 20 mm. As the sample, a 12 mm high, 50 mm long, and 30 mm wide silicone gel cured product shown above was fixed on a base and used.

[Tensile Deformation]

The tensile deformation rate was measured using a Texture Analyzer; a stress of 10 N was applied on the specimen at a rate of 0.5 mm/sec and held for 10 seconds. The specimen was pulled up to a height of 20 mm at the starting position at a rate of 0.5 mm/sec, and the value of the deformation rate was read for a 12-mm thick test specimen when no stress was exhibited. For those showing stress up to the test starting position 20 mm, the silicone gel cured product adhered to the probe, deformed, and could not be peeled off.

In the Examples and the like shown below, the following compounds or compositions were used as raw materials. The viscosity was measured by a rotatory viscometer at 25° C., and the Vi content is a content of a vinyl group portion ($CH_2=CH-$) in an alkenyl group. Component (A):

A-1: Dimethylpolysiloxane capped at both ends of the molecular chain by dimethylvinylsiloxy groups (viscosity 400 mPa·s, Vi content 0.43 mass %)

Component (B):

B-1: Copolymers of methylhydrogensiloxane and dimethylsiloxane capped at both ends of the molecular chain by trimethylsiloxy groups, average of 2 per molecule, average of 2 on a side chain of the molecular chain (viscosity 20 mPa·s, Si—H content 0.10 mass %)

Other Crosslinking Agents:

non-B-2: Copolymers of methylhydrogensiloxane and dimethylsiloxane capped at both ends of the molecular chain by trimethylsiloxy groups, average of 5 per molecule, average of 5 on a side chain of the molecular chain (viscosity 5 mPa·s, Si—H content 0.75 mass %)

non-B-3: Copolymers of dimethylsiloxane and methylhydrogensiloxane capped at both ends of the molecular chain by dimethylhydroxy groups, average of 2 per molecule, average of 0 on a side chain of molecular chain (viscosity 10 mPa·s, Si—H content 0.15 mass %)

Component (C):

C-1 Complex of platinum with a platinum concentration of 0.6 wt. % and 1,3-divinyl-1,1,3,3-tetramethyldisiloxane Component (D):

D-1: Crushed aluminum oxide powder having an average particle size of 0.4 μm

D-2: Crushed aluminum oxide powder having an average particle size of 2.5 μm

D-3: Spherical aluminum oxide powder having an average particle size of 35 μm

Component (E):

E-1: Decyltrimethoxysilane

Component (F):

F-1: 29H, 31H-phthalocyaninato (2-)-N29, N30, N31, N32 copper

TABLE 1

|  | Example 1 | Example 2 | Example 3 | Example 4 | Example 5 | Example 6 |
|---|---|---|---|---|---|---|
| A-1 | 100 | 100 | 100 | 100 | 100 | 100 |
| B-1 | 8.12 | 12.07 | 8.04 | 6.04 | 3.96 | 7.09 |
| non-B-2 | — | — | — | — | — | 0.13 |
| non-B-3 | — | — | 3.29 | 4.95 | 6.60 | — |
| C-1 | 0.15 | 0.15 | 0.15 | 0.15 | 0.15 | 0.15 |
| D-1 | 247 | 251 | 251 | 251 | 251 | 245 |
| D-2 | 273 | 277 | 277 | 277 | 277 | 271 |
| D-3 | 663 | 673 | 673 | 673 | 673 | 657 |
| E-1 | 4.2 | 4.2 | 4.2 | 4.2 | 4.2 | 4.1 |
| F-1 | 1.04 | 1.06 | 1.06 | 1.06 | 1.06 | 1.03 |

TABLE 1-continued

|  | Example 1 | Example 2 | Example 3 | Example 4 | Example 5 | Example 6 |
|---|---|---|---|---|---|---|
| Phenylbutynol | 0.0065 | 0.0066 | 0.0066 | 0.0065 | 0.0066 | 0.0064 |
| Si—H[$H_B$]/alkenyl group molar ratio | 0.50 | 0.75 | 0.50 | 0.38 | 0.25 | 0.44 |
| Si—H([$H_B$] + [$H_{non-B}$])/alkenyl group molar ratio | 0.50 | 0.75 | 0.75 | 0.75 | 0.75 | 0.50 |
| [$H_{non-B}$]/[$H_B$] + [$H_{non-B}$] | 0.0 | 0.0 | 0.33 | 0.50 | 0.67 | 0.13 |
| Type E hardness | 15 | 69 | 55 | 44 | 18 | 27 |
| Compression deformation (%) | 26 | 2.2 | 3.6 | 5.2 | 11 | 11 |
| Tensile deformation (%) | −15 | −3.4 | −3.5 | −7.1 | −25 | −14 |

TABLE 2

|  | Comparative Example 1 | Comparative Example 2 | Comparative Example 3 | Comparative Example 4 | Comparative Example 5 |
|---|---|---|---|---|---|
| A-1 | 100 | 100 | 100 | 100 | 100 |
| B-1 | — | — | — | 3.03 | 2.37 |
| non-B-2 | — | — | — | — | — |
| non-B-3 | 6.60 | 9.89 | 12.66 | 7.39 | 7.92 |
| C-1 | 0.15 | 0.15 | 0.15 | 0.15 | 0.15 |
| D-1 | 243 | 251 | 251 | 251 | 251 |
| D-2 | 269 | 277 | 277 | 277 | 277 |
| D-3 | 653 | 673 | 673 | 673 | 673 |
| E-1 | 4.1 | 4.2 | 4.2 | 4.2 | 4.2 |
| F-1 | 1.02 | 1.06 | 1.06 | 1.06 | 1.06 |
| Phenylbutynol | 0.0064 | 0.0066 | 0.0066 | 0.0066 | 0.0066 |
| Si—H [$H_B$]/alkenyl group molar ratio | 0.0 | 0.0 | 0.0 | 0.19 | 0.15 |
| Si—H([$H_B$] + [$H_{non-B}$])/alkenyl group molar ratio | 0.50 | 0.75 | 0.96 | 0.75 | 0.75 |
| [$H_{non-B}$]/[$H_B$] + [$H_{non-B}$] | 1.0 | 1.0 | 1.0 | 0.75 | 0.80 |
| Type E hardness | 0 | 0 | 15 | 16 | 9 |
| Compression deformation (%) | 94 | 88 | 38 | 21 | 54 |
| Tensile deformation (%) | Cannot peel off | Cannot peel off | Cannot peel off | Cannot peel off | Cannot peel off |

TABLE 3

|  | Comparative Example 6 | Comparative Example 7 |
|---|---|---|
| A-1 | 100 | 100 |
| B-1 | 1.32 | — |
| non-B-2 | — | 0.13 |
| non-B-3 | 8.71 | 5.79 |
| C-1 | 0.15 | 0.15 |
| D-1 | 251 | 242 |
| D-2 | 277 | 267 |
| D-3 | 673 | 649 |
| E-1 | 4.2 | 4.1 |
| F-1 | 1.06 | 1.02 |
| Phenylbutynol | 0.0066 | 0.0064 |
| Si—H[$H_B$]/alkenyl group molar ratio | 0.08 | 0.0 |
| Si—H([$H_B$] + [$H_{non-B}$])/alkenyl group molar ratio | 0.74 | 0.50 |
| [$H_{non-B}$]/[$H_B$] + [$H_{non-B}$] | 0.89 | 1.0 |
| Type E hardness | 6 | 0 |
| Compression deformation (%) | 81 | 93 |
| Tensile deformation (%) | Cannot peel off | Cannot peel off |

As shown in Examples 1 to 6, each of the thermally conductive silicone gel compositions (design value of thermal conductivity: 3.5 W/mK) according to the present invention showed a stress relaxation by compression deformation due to stress, but could be easily peeled off under constant deformation by subsequent tensile stress, and showed repairability.

On the other hand, Comparative Examples 1 to 3 and 7 containing no component B-1 of the present invention showed a stress relaxation by compression deformation due to stress; however, the peelability was insufficient by subsequent tensile stress, so the silicone gel cured product was deformed and the repairability could not be improved. Also, the composition was not suitable for the use which is the object of the present invention. Comparative Examples 4 to 6 in which the component B-1 was used, but the ratio of non-B3 was outside the scope of claims showed same results, i.e. the peelability was insufficient and the repairability could not be improved.

What is claimed is:

1. A thermally conductive silicone gel composition comprising:
   (A) 100 parts by mass of an alkenyl group-containing organopolysiloxane having a viscosity of from 10 to 100,000 mPa·s at 25° C.;
   (B1) a straight-chain organohydrogenpolysiloxane containing an average of 2 silicon-bonded hydrogen atoms only in the side chain of the molecular chain and having a viscosity of from 1 to 1,000 mPa·s at 25° C.;
   (non-B) an organohydrogenpolysiloxane other than component (B1);
   (C) a catalytic amount of a hydrosilylation reaction catalyst;
   (D) 400 to 3,500 parts by mass of a thermally conductive filler;
   (E) 0.1 to 2.0 mass % of an alkoxysilane having an alkyl group with 6 or more carbon atoms per molecule with respect to component (D); and
   (F) a heat resistance imparting agent;
      wherein the total amount of silicon-bonded hydrogen atoms in components (B1) and (non-B) is from 0.2 to 5 mol per 1 mol of an alkenyl group contained in component (A);
      wherein component (non-B) is an organohydrogenpolysiloxane selected from the group consisting of:
         i) copolymers of methylhydrogensiloxane and dimethylsiloxane capped at both ends of the molecular chain by trimethylsiloxy groups, having on average more than 4 silicon-bonded hydrogen atoms per molecule; and
         ii) copolymers of methylhydrogensiloxane and dimethylsiloxane capped at both ends of the molecular chain by dimethylhydrogensiloxy groups, having on average more than 4 silicon-bonded hydrogen atoms per molecule;
         wherein the content of silicon-bonded hydrogen atoms in component (B1) ($[H_B]$) and the content of silicon-bonded hydrogen atoms in organohydrogenpolysiloxane(s) other than component (B1) ($[H_{non-B}]$) in the composition, that is the value of $[H_{non-B}]/([H_B]+[H_{non-B}])$, is in the range of greater than 0.0 to 0.70; and
         wherein component (D) is: (D1) a lamellar boron nitride powder having an average particle size of 0.1 to 30 μm; (D2) a granular boron nitride powder having an average particle size of 0.1 to 50 μm; (D3) a spherical and/or crushed aluminum oxide powder having an average particle size of 0.01 to 50 μm; (D4) a graphite having an average particle size of 0.01 to 50 μm; or a mixture of two or more of these.

2. The thermally conductive silicone gel composition according to claim 1, wherein component (E) is an alkoxysilane represented by the following structural formula:

$$Y_nSi(OR)_{4-n}$$

wherein Y is an alkyl group having 6 to 18 carbon atoms, R is an alkyl group having 1 to 5 carbon atoms, and n is 1 or 2.

3. The thermally conductive silicone gel composition according to claim 1, wherein component (E) is a trialkoxysilane having an alkyl group having 6 to 18 carbon atoms.

4. The thermally conductive silicone gel composition according to claim 1, wherein component (D) is surface treated with component (E).

5. The thermally conductive silicone gel composition according to claim 1, wherein component (F) is a phthalocyanine compound.

6. The thermally conductive silicone composition according to claim 1, wherein component (D3) is present and comprises a mixture of two or more spherical and/or crushed aluminum oxide powders having different average particle sizes of from 0.01 to 50 μm.

7. The thermally conductive silicone composition according to claim 1, wherein the value of $[H_{non-B}]/([H_B]+[H_{non-B}])$ is in the range of greater than 0.0 to 0.50.

8. The thermally conductive silicone composition according to claim 7, wherein the value of $[H_{non-B}]/([H_B]+[H_{non-B}])$ is in the range of greater than 0.0 to 0.25.

9. A thermally conductive member comprising the thermally conductive silicone gel composition according to claim 1.

10. A thermally conductive member obtained by curing the thermally conductive silicone gel composition according to claim 1.

11. A heat dissipation structure comprising the thermally conductive member according to claim 9.

12. The heat dissipation structure according to claim 11, which is an electric/electronic device.

13. The heat dissipation structure according to claim 11, which is an electric/electronic component or a secondary battery.

14. A heat dissipation structure comprising the thermally conductive member according to claim 10.

15. The heat dissipation structure according to claim 14, which is an electric/electronic device.

16. The heat dissipation structure according to claim 14, which is an electric/electronic component or a secondary battery.

17. The thermally conductive silicone composition according to claim 6, wherein component (D3) comprises a mixture of three different spherical and/or crushed aluminum oxide powders having different average particle sizes of from 0.01 to 50 μm.

18. The thermally conductive silicone composition according to claim 1, wherein component (non-B) comprises:
   ia) a copolymer of methylhydrogensiloxane and dimethylsiloxane capped at both ends of the molecular chain by trimethylsiloxy groups, having an average of 5 silicon-bonded hydrogen atoms per molecule and only present in the side chain of the molecular chain, optionally with a viscosity of 5 mPa·s, and optionally with a Si—H content of 0.75 mass %.

19. The thermally conductive silicone gel composition according to claim 5, wherein component (F) is a copper phthalocyanine compound, or optionally is 29H, 31H-phthalocyaninato (2-)-N29, N30, N31, N32 copper.

20. The thermally conductive silicone gel composition according to claim 5, wherein component (F) is present in an amount of from 0.01 to 5.0 mass %, or optionally of from 0.05 to 0.2 mass %, of the total composition.

* * * * *